United States Patent
Miller et al.

(10) Patent No.: US 8,289,038 B2
(45) Date of Patent: Oct. 16, 2012

(54) METHOD AND DEVICE FOR CHARACTERISING SENSITIVITY TO ENERGY INTERACTIONS IN AN ELECTRONIC COMPONENT

(75) Inventors: Florent Miller, Paris (FR); Nadine Buard, Meudon (FR); Imad Lahoud, Paris (FR); Thierry Carriere, Triel sur Seine (FR); Patrick Heins, Castelnau de Montmiral (FR)

(73) Assignee: European Aeronautic Defence and Space Compai, Paris (FR)

( * ) Notice: Subject to any disclaimer, the term of this patent is extended or adjusted under 35 U.S.C. 154(b) by 584 days.

(21) Appl. No.: 12/297,743

(22) PCT Filed: Apr. 18, 2007
(Under 37 CFR 1.47)

(86) PCT No.: PCT/FR2007/051130
§ 371 (c)(1),
(2), (4) Date: Oct. 30, 2009

(87) PCT Pub. No.: WO2007/119030
PCT Pub. Date: Oct. 25, 2007

(65) Prior Publication Data
US 2010/0148790 A1    Jun. 17, 2010

(30) Foreign Application Priority Data
Apr. 19, 2006  (FR) ..................... 06 51382

(51) Int. Cl.
*G01R 31/308* (2006.01)
*G01R 31/26* (2006.01)

(52) U.S. Cl. ......... 324/750.01; 324/754.23; 324/762.05; 250/453.11; 250/492.2; 250/336.1; 702/108; 702/134

(58) Field of Classification Search .................. 324/501, 324/750.01, 754.23; 250/453.11, 336.1–395; 702/108–134
See application file for complete search history.

(56) References Cited

U.S. PATENT DOCUMENTS

| | | | | |
|---|---|---|---|---|
| 4,786,865 A | * | 11/1988 | Arimura et al. | 324/754.23 |
| 5,966,019 A | | 10/1999 | Borden | |
| 6,154,477 A | * | 11/2000 | Weidenheimer et al. | 372/50.12 |
| 7,560,940 B2 | * | 7/2009 | Desplats et al. | 324/754.23 |
| 7,872,489 B2 | * | 1/2011 | Dickson et al. | 324/762.02 |
| 2005/0006602 A1 | * | 1/2005 | Perdu et al. | 250/492.22 |

FOREIGN PATENT DOCUMENTS

| | | |
|---|---|---|
| EP | 1679522 A1 | 7/2006 |
| GB | 2248965 A | 4/1992 |
| WO | 2005022180 A1 | 3/2005 |

OTHER PUBLICATIONS

International Search Report dated Oct. 31, 2007 and French Search Report dated Dec. 19, 2006.

* cited by examiner

*Primary Examiner* — Melissa Koval
*Assistant Examiner* — Emily Chan
(74) *Attorney, Agent, or Firm* — Perman & Green, LLP

(57) ABSTRACT

To analyze an electric component in depth, provision is made to submit the aforementioned component to focused laser radiation. It is shown that by modifying the altitude of the focus in the component, some internal parts of the aforementioned component can be characterized more easily.

9 Claims, 4 Drawing Sheets

METHOD AND DEVICE FOR CHARACTERISING SENSITIVITY TO ENERGY INTERACTIONS IN AN ELECTRONIC COMPONENT

CROSS-REFERENCE TO RELATED APPLICATIONS

This application is the National Stage of International Application No. PCT/FR2007/051130 International Filing Date, 18 Apr. 2007, which designated the United States of America, and which International Application was published under PCT Article 21 (s) as WO Publication 2007/119030 A3 and which claims priority from, and the benefit of, French Application No. 0651382 filed on 19 Apr. 2006.

BACKGROUND

The object of the disclosed embodiment is a method and device for measuring energy interactions in an electronic component. The purpose of the disclosed embodiment is to improve the characterization of electronic components with respect to attacks of this nature.

SUMMARY

Naturally or artificially radiant environments (neutrons, protons, heavy ions, flash X or gamma rays) can interfere with the function of electronic components. These attacks are caused by interactions between the material and the particles of the radiant environment. One of the consequences of this is the creation of parasitic currents in the component. Such parasitic currents vary in strength according to the site of the interactions between the material and the particles. This expresses the presence of isolated charge collection zones within the component.

Interference of this kind by heavy ions and protons and is typically encountered in space, by satellites and space shuttles. At the lower altitudes used by aircraft, neutrons occur most frequently. Attacks of this nature may also be encountered at ground level, where they can affect electronic components fitted in portable devices or cars.

It is very important to know the shape and position of the charge collection zones inside the components in order to be able to research the sensitivity of the component to radiant environments, and indeed to any kind of phenomenon caused by the creation of parasitic charges in electronic components, due to electrostatic discharges (ESD), for example.

In order to be able to predict the behaviour of components when they are exposed to heavy ions, neutrons and protons, particularly for space and aeronautical applications, it is necessary to know not only the dimensions of the charge collection zones in terms of surface area, but also their characteristics in depth, which requires the ability to create maps in three dimensions.

The conventional method of analyzing the sensitivity of an electronic component to radiation is to bombard the component with a stream of particles and record the interference events that occur. Since this type of test involves radiating the entire component, it cannot be used to identify the location of the charge collection zones. Moreover, these tests are rather costly, because there are relatively few facilities in the world that are capable of generating the requisite particle streams. Finally, even if the particles used in a particle accelerator are the same as those present in the radiant environment, their energy levels may be different. This can result in serious errors, particularly with regard to the depth to which the particles penetrate the component.

Narrow beams can be obtained from the outputs of particle accelerators. It is then possible to use these microbeams to map the sensitivity zones of a component. This mapping is carried out in one plane and can only be used to show the location of these charge collection zones on the surface. This type of test does not yield any information about the depth to which the sensitive zone extends.

Previously, the laser was used primarily as a tool for preliminary characterization tool of the sensitivity of components to radiation. Like the particles in the radiant environment, at the appropriate wavelength the laser can generate parasitic currents inside components.

The laser has one very significant advantage for the purposes of studying the effects of radiation. Since the spatial resolution of the laser is able to achieve relatively small dimensions with respect to the elementary structures in electronic components, it is possible to create a map of an electronic component, as with a microbeam, and to identify its charge collection zones. Until now, it has suffered from the same limitation as the microbeam, namely it has not been possible to obtain detailed information about the location at depth of the sensitive zone inside the component, nor about its thickness.

A method based on non-linear absorption (using two photons) is known that addresses this drawback. However, the laser source used is non-industrial and the method is extremely difficult to perform outside of a laboratory.

The object of the disclosed embodiment is a method that enables the position at depth and the thickness of the charge collection zones to be determined in any electronic component, using a laser probe of fixed wavelength within the absorption band of the semiconductor. Essentially, the laser radiation of the disclosed embodiment is focused. In order to explore the thickness of the component, the laser radiation focus is moved inside the component thickness. This movement may be effected by translation or by more or less convergent focusing. The description that follows is based on the method using translation. For the variation using convergence, it is necessary to select different calculation methods, which are however within the capabilities of one skilled in the art, and are no more than simple optical constructions.

The method of the disclosed embodiment may be used to determine the sensitivity of electronic components to radiation on the basis of laser tests: the information about the geometry of the charge collection zones in the components are then used as input parameters in error prediction simulations with regard to the particles (heavy ions, neutrons, protons, etc.).

Finally, the method of the disclosed embodiment is able to reveal the weaknesses of a technology in terms of resistance to radiation, which is important information for the development of new components in terms of the methods of manufacturing them.

It should be noted that the laser sources used in the disclosed embodiment are inexpensive, very reliable, and available commercially, and therefore fitting for an industrial environment.

Accordingly, a further object of the disclosed embodiment is a method for characterizing sensitivity to energy interactions in an electronic component, in which,
    the electronic component is activated,
    the electronic component thus activated is excited using laser radiation,
    a malfunction of the activated electronic component corresponding to this excitation is measured, and a map is created of the locations of interest in the component where these interactions are strongest, wherein, the laser radiation is focused to various depths in the component and the energy interactions for these different depths are measured.

BRIEF DESCRIPTION OF THE DRAWINGS

The disclosed embodiment will be understood more clearly if the following description is read with reference to the accompanying figures. The figures are for exemplary purposes only, and are not limiting of the disclosed embodiment in any way. The figures show.

DETAILED DESCRIPTION

Figure 1:
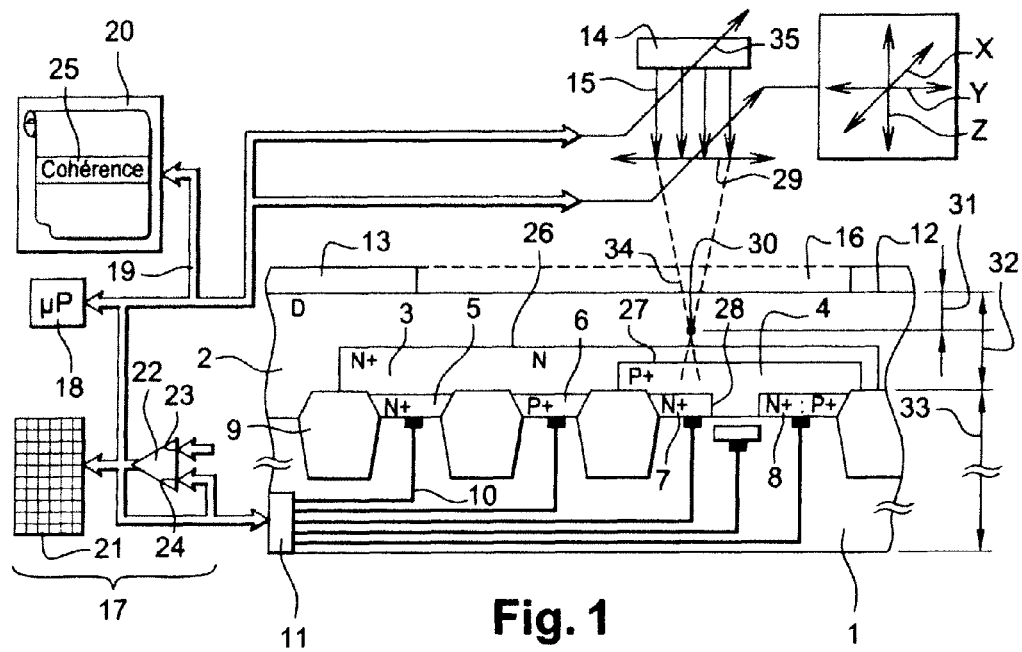
FIG. 1: A schematic representation of a device that may be used to perform the method according to the disclosed embodiment.

FIG. 1 shows a device that may be used to perform the method according to the disclosed embodiment. The objective of the disclosed embodiment is to measure the effects of energy interactions in an electronic component 1. A semiconductor crystal 2 furnished with various implants is therefore attached in known manner and as described overleaf to electronic component 1: such implants may include casings such as 3, wells such as 4 in such a casing 3, and zones that have been embedded by impurities such as 5 to 8. While such may not be construed as limiting of the disclosed embodiment, semiconductor crystal 2 is a p-type silicon crystal in which casing 3 is implanted with N+ type impurities, well 4 is implanted with P+ type impurities, zones 5 to 8 are implanted with impurities of various kinds depending on the electronic functions and connections that must be created in order to produce the electronic component. Concentrations of impurities in components of this kind are usually in the order of between 1015 and 1023. The implanted zones 5 and 6 as well as the casings 3 and wells 4 are separated from each other by silicon oxide barriers such as 9. Connections such as 10, which are typically metallic and created by vaporization of the connections, are created in known manner and end at an interface 11 with electronic component 1. Base surface 12 of semiconductor wafer 2 typically rests on a protection element 13, preferably a metallization. In some cases, protection element 13 is made from an extremely hard material, for example cobalt. Protection element 13 is located on a face of crystal 2 opposite the one in which implants 5 to 8 are located.

According to the disclosed embodiment, the electronic component that is likely to be exposed to energy interactions is excited with a laser source 14 so that the malfunctions in the component may be measured. This laser source 14 emits radiation 15 which attacks electronic component 2. In order to optimize the effects of such an attack, component 1 is preferably exposed to the attack at its base 12. In order to optimize the effects of such attack, a window 16 is preferably opened in protection element 13 (particularly by a chemical or mechanical process), through which radiation 15 from laser 14 may reach the component.

During testing, electronic component 1 is connected to a power supply and control device 17 via its interface 11. As shown schematically, device 17 includes a microprocessor 18, which is connected via a data, address and control bus 19 to a program memory 20, a data memory 21, interface 11 with laser source 14, and a laser energy attenuation system 35. Device 17 also includes a comparator 22, also shown schematically, receiving both an expected electrical value via a preset input 23 and electrical signals recorded by interface 11 in component 1 via a measurement input 24 while the component is exposed to interactions and excitations from laser 14.

Comparator 22 may be replaced by a subroutine for measuring the coherence of the signal received from electronic component 1 with an expected signal. The measurement function may be static: in this case, only the values of voltages and currents present at the contact points on interface 11 are tested. It may also be dynamic. In this case, microprocessor 18 is also equipped with a clock that times certain operations, the sequence of which must conform to a known journal, and measurements are taken to determine whether this journal is reproduced in the expected manner, or there are anomalies.

Particularly with microprocessor 18, it is known conventionally to move source 14 in directions XY relative to surface 12 of crystal 2. When making this move, it is possible to register the locations of interest, where measurements have shown that the interactions between radiation 14 and semiconductor 1 are strongest, and are indeed becoming critical. However, this knowledge is not sufficient. It still provides no information about depth.

The hole formed by window 16 is smaller than the dimension of wafer 2 in component 1. Hole 16 is small because, if it is made too large, the conditions of electrical operation of component 1 way be altered. In particular, it is essential to ensure that the electrical connection of layer 13 can be maintained. This being the case, the trace of the impact of radiation 15 on surface 12 is naturally smaller than hole 16, otherwise it would serve no purpose to displace window 16 in directions X and Y. Moreover, despite all the precautions taken, the dimensions of the implantation zones such as 5 to 8 are much smaller than the trace of the impact from laser radiation 15. This is not shown fully in FIG. 1 for reasons of clarity. In practice, however, the trace of the impact is significantly larger than the size of an elementary function in the electronic component. For example, with regard to a static type memory cell, the area of the impact trace is significantly greater than that of a memory cell of this static memory.

Using this technique, it is known to identify the zones of interest in component 1 in the sense that these zones are the sites of interactions that are harmful to the functioning of component 1. The objective of the disclosed embodiment is to determine the exact part of the component that is the site of such harmful interaction. Typically, the question to be answered is whether the area concerned is that of the bottom 26 of casing 3, the bottom 27 of well 4, or the interface area 28 of one of the implanted zones 5 to 8. Knowing this depth may lead to changes being made to the level at which impurities are implanted in the various zones, to strengthen the component with regard to these interactions.

In order to achieve this result, provisions have been made in the disclosed embodiment to focus laser radiation 15 using a focusing device, represented schematically here by a lens 29, and to use this lens 29 to vary a focusing depth Z of a focus 30 of the radiation 15 focused thereby. For example, a depth 31, as illustrated, in this case is located below surface 12 but above the surface of the bottom 26 of casing 3. A height 32 of the crystal of semiconductor 2 is generally in the order of 300 micrometres, whereas the height used for separation oxides 9 may be in the order of 600 micrometres. Of course, account is also taken of the fact that the refractive index of crystal 2 is different from the refractive index of air. This is not shown in FIG. 1, where the focused radiation is indicated by straight beams 34. According to the disclosed embodiment, the energy interactions of the radiation on component 1 are measured for each focusing depth. This measurement is taken according to the following principle.

Once laser source 14 has been positioned with respect to a zone of interest (measured as described previously), for a first given focusing operation, e.g., on surface 12, commands are transmitted to attenuator 35 using microprocessor 18 and bus 19 to adjust the attenuation level of the laser energy, and microprocessor 18 and bus 19 are also used to command source 14 to emit a laser pulse. Reducing the attenuation level of attenuator 30 causes the laser energy to increase. As a result of this increase, the laser power that is dissipated in component 1 increases. In practice, this application of energy excitations may be pulsed (particularly to prevent the component from being heated excessively by continuous illumination). In addition, power may be adjusted incrementally, though this is a preference and not obligatory. Experimentally, the energy (power) value is highest at the start, and is reduced until the critical value is obtained (but the reverse is also possible: starting with the lowest energy value and increasing the value progressively). The coherence of the signal read in component 1 with an expected signal is measured at the end of each pulse. If this coherence is good, the attenuation is reduced. At a certain point, a critical power is reached, the power for which, for the first time, the electronic response from component 1 is not what is expected. The value of this critical power is noted.

Then the focusing position of the laser source is changed, for example by moving lens 29 towards component 1 (or possibly by using a lens with variable focal length), such that focus 30 is advanced farther inside crystal 2. The process of increasing (or decreasing as desired) the power is repeated for this new position at depth of this focus 30, and a new value for the critical power is obtained. By proceeding in this manner, it is possible to record a map in depth, not simply of the surface, of the malfunctioning of electronic component 1.

In fact, the spatial distribution of a laser beam at the focal point of an objective is ideally modeled by Gaussian curve in a plane, and by a decreasing exponential in depth. In two dimensions, the energy density $I_{laser}$ of the beam propagating in a medium with index n is expressed by:

$$I_{laser} = I_0 e^{\frac{-2(x+y)^2}{\omega(z)^2}} e^{-\alpha z} \text{ and } \omega(z) = \omega_0^2 \left(1 + \left(\frac{\lambda(z - z_0)}{pn\omega_0^2}\right)^2\right)$$

where: ?0=width of the beam at the focusing point (in this case at z=z0).

n=index of the propagation medium.

Io=density of incident laser energy before it penetrates the semiconductor in J/cm2)

After focusing, the beam widens again rapidly as soon as it passes the focusing point. When the beam penetrates a semiconductor, made from silicon for example, the refractive properties due to the difference between the indices of air (nair=1) and silicon (nsi=3.5) have the effect that, in the absence of an air/silicon interface at position z=0, the beam would be focused on z=z0', but with the interface present, the focusing point would be advanced to depth z=z0, with the parameter ? oSi as the characteristic beam defined at 1/e2 of maximum intensity. This parameter is called the "beam waist" in English.

Using the properties of Gaussian beams and their transmission at interfaces, it may be shown that:

$$\omega_{osi} = \omega_{oair} = \omega_0 z_0 = n_{si} x z_0'$$

The beam is focused at a depth zo in the silicon with a characteristic beam defined at 1/e2 of maximum intensity identical to that which it would have had without the interface. A variation of dz in the normal identification point therefore translates to a variation of nsi.dz in silicon.

Figure 2:
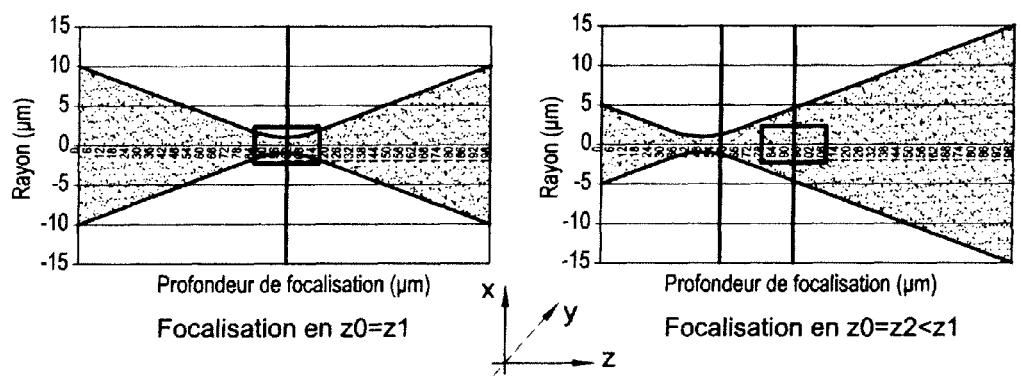
FIG. 2: A graphical representation of the effects of offsetting the focus of the laser according to the disclosed embodiment.

FIG. 2 shows two schematic examples of propagation in silicon with focusing points at different depths. If the energy h? of the laser beam photons is greater than the potential barrier in crystal 2, these photons are able to create free charges within the semiconductor along the length of their passage.

It can be shown that the volume density of charges (e.g., the electrons symbolised by n) introduced by a laser beam having incident energy density Io as far as depth z in the semiconductor is:

$$n(x, y, z) = \cdot \eta \cdot (1 - R) \cdot \frac{\lambda}{hc} \cdot \alpha \cdot I_{laser}(x, y, z)$$

where:

h=Planck's constant.

c=speed of light.

λ=laser wavelength.

(1−R) Ilaser=density of laser energy penetrating the semiconductor.

α=coefficient of absorption of the semiconductor.

?=quantum efficiency ~1.

Figure 3:
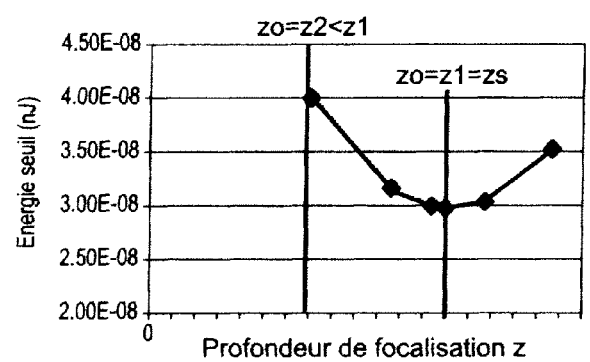
FIG. 3: In a zone of interest, the map of critical energy for which interactions are critical depending on the focusing depth.

Suppose that the sensitive charge collection zone is represented physically by the rectangle and is located at a depth of z=zs. The laser beam will create more charges in the collection zone when it is focused on zo=z1=zs than when it is focused on zo=z2 (where z2 is different from z1). Charge collection will therefore be more efficient in the first case, and the laser energy required to obtain a given quantity of collected charges (hereinafter called the critical energy) will be reduced. This critical energy corresponds to a critical power for a given pulse duration. If the curve of the critical energy, also called threshold energy, plotted against focusing depth zo, is traced in the configuration of FIG. 2, it will have the shape shown in FIG. 3. It is the application of this curve (study of minimum) that provides the depth of the sensitive collection zone (in this case zs). In fact, more laser power is required at z2 (<z1) to disrupt the operation of component 1. Less power is required at z1. Therefore, height zone z1 is more sensitive than height zone z2.

Figure 4:
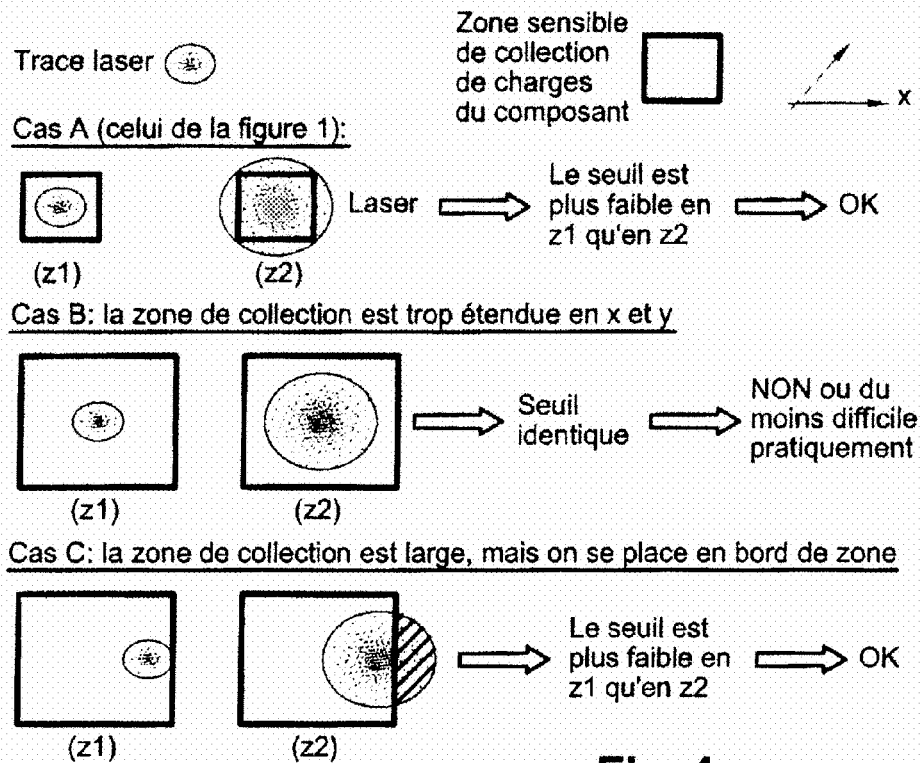
FIG. 4: A schematic representation of three examples in an known zone of interest, in which the explanation of defocusing the laser bears out the results of FIG. 3.

If one considers the other two directions X and Y, it will be noted that this does not happen in all cases under review. In fact, FIG. 4 shows three more examples, A, B and C. In example A, the collection zone is smaller than the laser beam (represented by a disc on the figure) at z2 and larger than the beam at z1. Therefore, the critical threshold will be lower at height zone z1 than at height zone z2. In example B, since the sensitive zone is considerably larger than the width of the laser beam, the critical threshold will be the same everywhere. The experiment is not conclusive, except to show that a much shorter focal length must be used to achieve the conditions of example A. In example C, for which the sensitive zone is of the same type as for example B, (for a given focusing convergence), it is observed that the method enables the heights of the edges of the sensitive area to be detected (particularly due to neutralization of a portion of the laser radiation that reaches a zone where it does not produce parasitic currents in the component). In this case, the critical power is greater. Therefore, the edge of the zone corresponds precisely with the position in X and Y of source 14 for which the power that is useful for revealing the phenomenon starts to become greater than for an adjacent location.

It is therefore not necessary to position the focus of the exploration in a zone of interest that has been defined beforehand on the surface, or more generally in X and Y, before starting to explore in depth, in Z. Typically, exploration may begin anywhere, and the X, Y and Z coordinates of the various focuses may be determined according to any strategy, even randomly, both in terms of depth and on the XY plane. In the same way, in order to change the depth of focusing inside the component, one may decide to alter the wavelength of the laser radiation, in fixed increments for example, rather than moving lens 29 relative to the component.

It is essential to use a laser for which the material under investigation is not transparent. The energy of the laser photon must be greater than the potential barrier, the energy gap of the semiconductor. In the case of silicon, the wavelength of the laser must be shorter than 1.1 micrometre. On the other hand, it must be ensured that the laser is able to penetrate far enough into the silicon to be able to excite zones that are buried at depth.

The duration of the laser pulse has no real significance for this method since the pulse duration only affects the threshold for triggering the phenomenon. Provided the laser has sufficient energy, the choice of pulse duration is not critical.

The smaller the size of the laser trace, or spot, the more sensitive the method becomes. For example, we have succeeded in showing that a spot size of 4 micrometres is ideally suited to the method with a wavelength of 1.06 micrometres.

The laser beam may be incident on the front face of the component (electrode side) or the rear face (substrate 2). Since the laser beam does not penetrate metallizations, irradiation via the rear face is preferable for revealing all sensitive zones. However, the method may be applied in either direction.

Threshold energy is defined as the laser energy required in order to obtain a given quantity of collected charges, called the critical charge. Without in any way limiting the effects that may be studied, for analogue components that may be reflected by a given transient current level at output or by triggering of a destructive failure. For SRAM memories, it may be reflected as the energy or critical charge that enables a bit state change or triggering of a parasitic phenomenon known as latchup.

Figure 5:
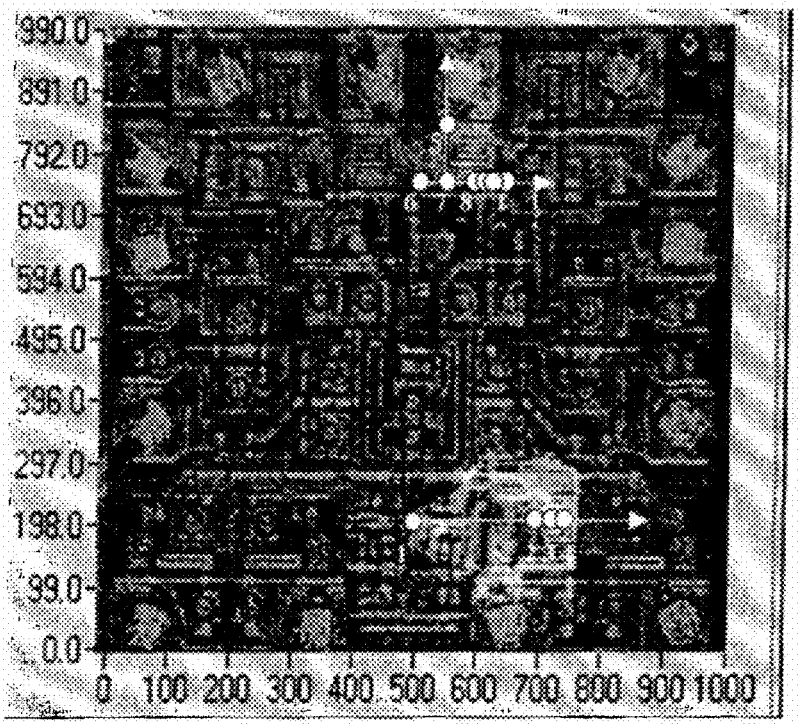
FIGS. 5 to 7: The representation of the various zones of interest on a component, with their correspondences, FIGS. 6 and 7 in the signals detected.

Accordingly, the first step is to create a laser map in two dimensions, in directions X and Y of the component. The entire surface of the component is scanned by the laser. For each scan position, the laser energy at which the observed phenomenon is triggered is recorded. An example of laser mapping showing two clear sensitive zones is shown in FIG. 5. Investigation in depth is then carried out according to the principle described previously on a given number of points of interest. It is typically carried out for points 1 to 4 in one case and points 5 to 11 in the other.

Here, the method is applied to an electronic component of the comparator type. Two charge collection zones have been identified by the laser mapping procedure. Sensitivity studies in depth have been conducted at different points, at the centre and edges of these charge collection zones for each of these two-dimensional zones.

As was explained previously, and will be confirmed in the following text discussing the theoretical aspect of the method, the minimum of the curve Ethreshold=f(focusing depth) corresponds to the position at depth of the sensitive zone.

Figure 6:
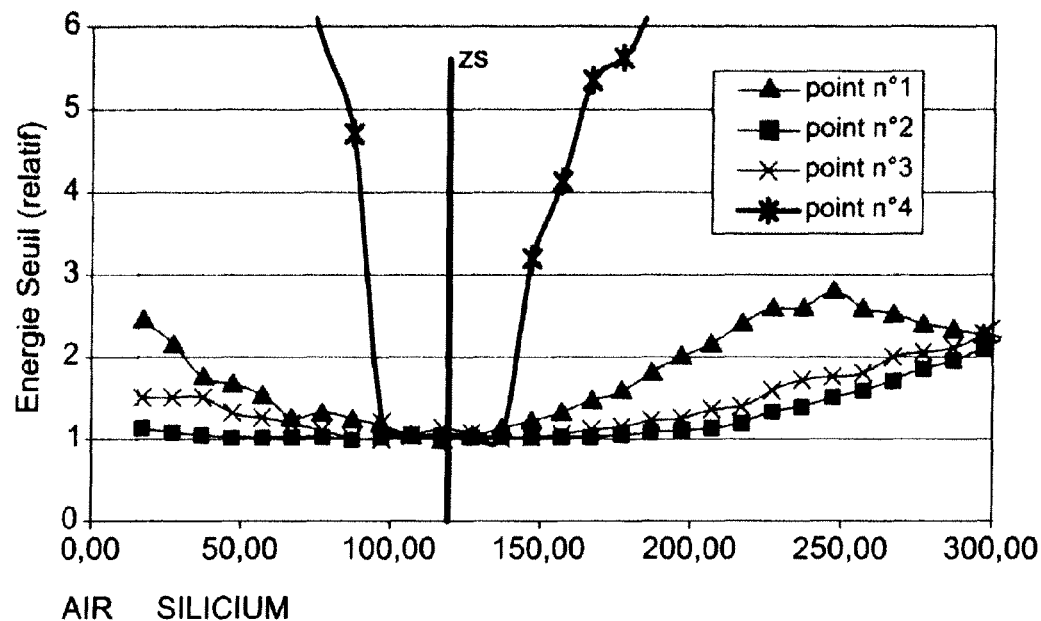
Figure 7:
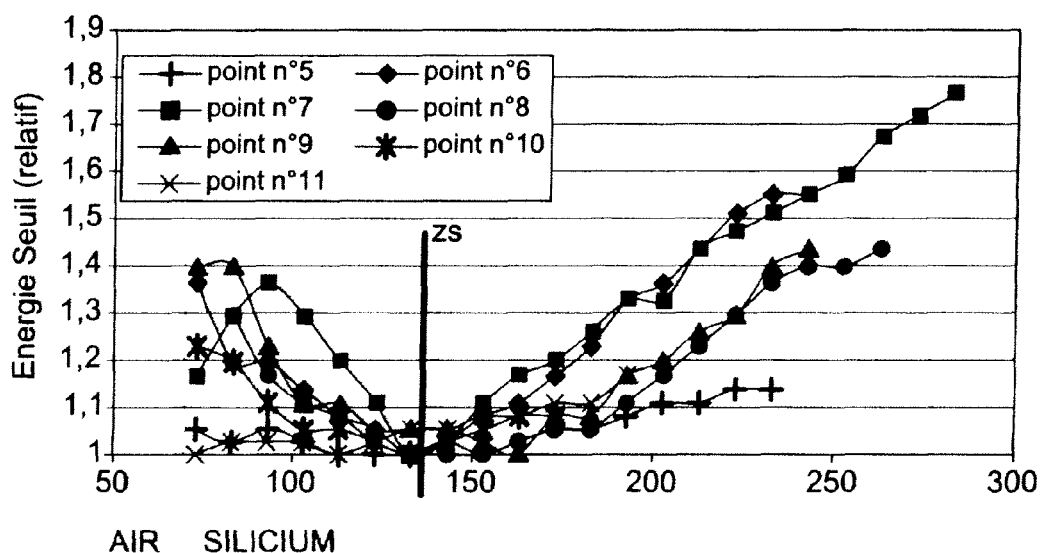

With the curve associated with point 4 of the first case, FIG. 6 shows above all that it is easier to determine the position in depth at the edge of the sensitive zone. For points 1 to 3, detection of the minimum is not as obvious, since the gradient is shallower. With reference to the zone containing points 5 to 11, shown in FIG. 7, the conclusions are the same. Point 7 enables the height of the sensitivity to be determined as 130 micrometres. If the distance of 60 micrometres between lens 29 and surface 12 is deducted, a height of 70 micrometres is obtained. Then, applying the ratio of the air-silicon refractive index, yields a final result of about 240 micrometres for the depth of the sensitive zone.

Taking into account the refractive index of silicon and the offset of the abscissa of the curve, the position of the minimum shows that that sensitive zone is located at a depth of about 340 micrometres measured from the rear face of the component (air silicon interface) for the zone of points 1 to 4, and at a depth of 240 micrometres for the zone of points 5 to 11.

Figure 8:
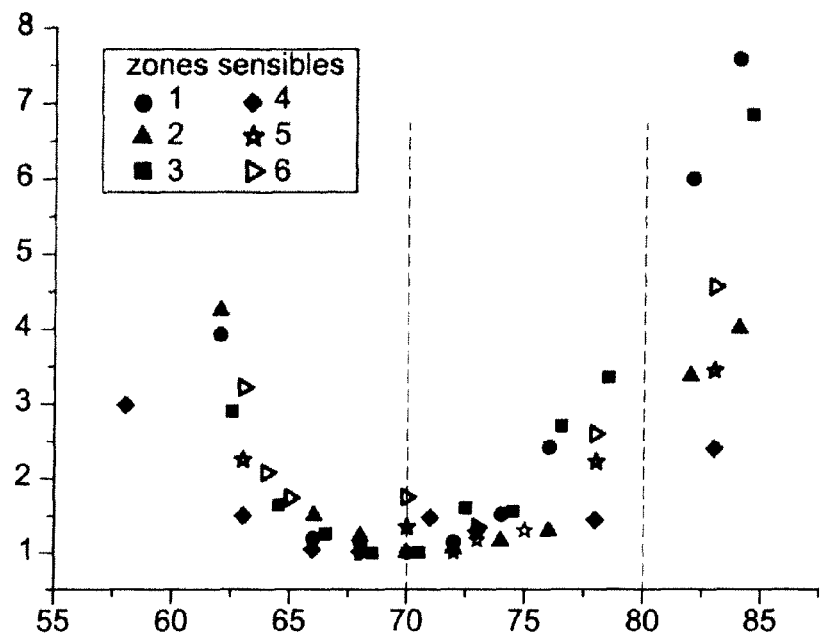
FIG. 8: A map of critical power depending on the defocusing depth for a second type of component.

In the case of static RAM-SRAM-type components, the width of the laser beam is such that $\omega(z)$ is larger than the dimensions of the memory point regardless of the position of the laser relative to the memory point. Accordingly, variations in $\omega(z)$ will entail variations in the threshold energy. Consequently, as shown in FIG. 8, a detection along the lines of example C of FIG. 4 is obtained. The method works as it should.

In theoretical terms, the sensitive zone having thickness h and sides a, b is located at (xs, ys, zs). The laser beam is focused on (xo, yo, zo) in the silicon.

Basing ones assumptions on the Rectangular Parallelepiped (RPP) model, that is to say that the charge collection zone is contained in a rectangular parallelepiped, it is possible to calculate the number of charges generated in this rectangular parallelepiped having sides a, b and h and located at depth zs in xs, ys, by a Gaussian beam focused on xo=0, yo=0, zo).

$$\eta_{charge} = \eta \cdot \frac{\lambda \cdot (1-R) \cdot \alpha}{h \cdot c} \cdot I_0 \cdot$$

$$\int_{z_s-\frac{h}{2}}^{z_s+\frac{h}{2}} \cdot e^{-\alpha \cdot z} \cdot \frac{\omega_0^2}{\omega(z)^2} \cdot \int_{x_s-\frac{a}{2}}^{x_s+\frac{a}{2}} \cdot e^{-\frac{2x^2}{\omega(z)^2}} \cdot \int_{y_s-\frac{b}{2}}^{y_s+\frac{b}{2}} \cdot e^{-\frac{2y^2}{\omega(z)^2}} \cdot dx \cdot dy \cdot dz$$

where $$I_0 = \frac{2 \cdot E_0}{\pi \cdot \omega_0^2}$$

and Eo, incident laser energy at z=0.

Integrating the preceding expression yields:

$$n_{charge} = \eta \frac{4 \cdot \lambda \cdot (1-R) \cdot \alpha}{h \cdot c} \cdot E_0 \cdot \int_{z_s - \frac{h}{2}}^{z_s + \frac{h}{2}} \cdot e^{-\alpha \cdot z} \cdot \left[ \text{erf}\left(\frac{\sqrt{2}}{\omega(z)} \cdot \left(\frac{a}{2} - x_s\right)\right) - \text{erf}\left(\frac{\sqrt{2}}{\omega(z)} \cdot \left(\frac{-a}{2} - x_s\right)\right) \right] \cdot \left[ \text{erf}\left(\frac{\sqrt{2}}{\omega(z)} \cdot \left(\frac{-b}{2} - y_s\right)\right) \right] \cdot dz$$

$$\omega(z) = \omega_0^2 \cdot \left[ 1 + \frac{\lambda(z - z_0)^2}{\pi \cdot n \cdot \omega_0^2} \right]^2$$

For the threshold laser energy Eo=Ethreshold corresponding to the critical charge ncharge=Qcrit, the following applies:

$$E_{threshold} = \frac{Q_{critique}}{\eta \cdot \frac{4 \cdot \lambda (1-R) \cdot \alpha}{h \cdot c} \cdot \int_{z_s - \frac{h}{2}}^{z_s + \frac{h}{2}} \cdot e^{\alpha \cdot z} \cdot \left[\text{erf}\left(\frac{\sqrt{2}}{\omega(z)} \cdot \left(\frac{a}{2} - x_s\right)\right) - \text{erf}\left(\frac{\sqrt{2}}{\omega(z)} \cdot \left(\frac{-a}{2} - x_s\right)\right)\right] \cdot \left[\text{erf}\left(\frac{\sqrt{2}}{\omega(z)} \cdot \left(\frac{b}{2} - y_s\right)\right) - \text{erf}\left(\frac{\sqrt{2}}{\omega(z)} \cdot \left(\frac{-b}{2} - y_s\right)\right)\right] dz}$$

The integral is calculated for example by the trapezoid method. This function describes the trend of the threshold energy as a function of the focusing depth. The profile of this expression yields the curve of FIG. 3, for example.

Function Erf(x) tends towards 1 when its argument is large. Therefore, in order to observe variations in threshold energy Ethreshold, the ratios:

$$\left(\frac{\sqrt{2}}{\omega(z)} \cdot \left(\frac{a}{2} - x_s\right)\right) \text{ and } \left(\frac{\sqrt{2}}{\omega(z)} \cdot \left(\frac{b}{2} - y_s\right)\right)$$

must vary, which is effective in examples A and C of FIG. 4, but not in B.

Accordingly, in the case of a sensitive zone for which dimensions a and b are significantly larger than ω(z) (regardless of the depth) (example B), the threshold energy will not vary.

Conversely, for identical ω(z), if the laser beam is fired at the edge of the sensitive zone, the threshold energy will vary because in this case $$\left(\frac{\sqrt{2}}{\omega(z)} \cdot \left(\frac{a}{2} - x_s\right)\right) \text{ and } \left(\frac{\sqrt{2}}{\omega(z)} \cdot \left(\frac{b}{2} - y_s\right)\right)$$

do vary.

Suppose that there is only one sensitive zone, which is located at a depth of $z_s$ and has a thickness h (see also FIG. 8). If the expression of $E_{threshold}$ as a function of z is derived, the result is:

$$\frac{\partial E_{threshold}}{\partial z} = Q_{crit} \times \frac{\frac{\partial n_{charge}}{\partial z}}{n_{charge}^2} = Q_{crit} \times \frac{\frac{\partial n_{charge}}{\partial z_s} \times \frac{\partial z_s}{\partial z}}{n_{charge}^2}$$

As was explained in 2.1.1, $$\frac{\partial z_s}{\partial z} = n_{si}.$$

The derivative of the curve representing the trend of the charge generated as a function of the depth thus enables the extremum of the function to be characterized. The expression of this derivative is given below (for the sake of clarity, the values of xs, ys, a and b are such that: xs=ys=0 and a=b, but the general calculation would yield identical results:

$$\frac{\partial n_{charge}}{\partial z} = n_{si} \times \eta \cdot \frac{\lambda \cdot (1-R) \cdot \alpha}{h \cdot c} \cdot E_o \cdot \left[ e^{-\alpha \cdot \left(z_s + \frac{h}{2}\right)} \cdot \left[\text{erf}\left(\frac{\sqrt{2}}{\omega\left(z_s + \frac{h}{2}\right)} \cdot \left(\frac{a}{2}\right)\right)\right]^2 - e^{-\alpha \cdot \left(z_s - \frac{h}{2}\right)} \cdot \left[\text{erf}\left(\frac{\sqrt{2}}{\omega\left(z_s - \frac{h}{2}\right)} \cdot \left(\frac{a}{2}\right)\right)\right]^2 \right]$$

and zs=nsi*z.

The extremum is given by:

$$\frac{\partial n_{charge}}{\partial z} = 0,$$

or:

$$e^{-\alpha \cdot h} \cdot \left[\text{erf}\left(\frac{\sqrt{2}}{\omega\left(z_s + \frac{h}{2}\right)} \cdot \left(\frac{a}{2}\right)\right)\right]^2 = \left[\text{erf}\left(\frac{\sqrt{2}}{\omega\left(z_s - \frac{h}{2}\right)} \cdot \left(\frac{a}{2}\right)\right)\right]^2$$

Since the product α.h tends towards 0 (α≈20 cm−1 for silicon and a level of doping less than 1017 cm3 and with a wavelength of 1.06 micrometres, z is in the order of a few to a few tens of micrometres), equality is achieved when zs, centre of the sensitive zone at depth, is equal to the focusing point of the laser zo, because then ω(z0+h/2)=ω(z0−h/2).

Thus, the minimum of the experimental curve characterizing the trend of the threshold energy as a function of the focusing depth does indeed correspond, based on the assumptions of the RPP model, to the depth at which the sensitive zone is buried.

Figure 9:
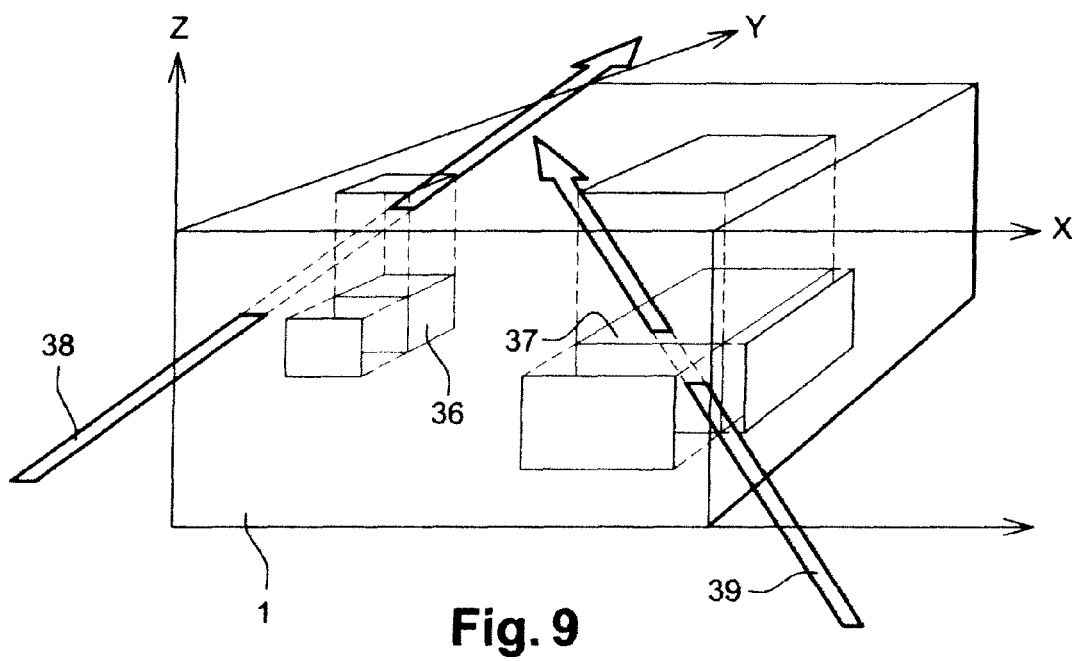
FIG. 9: The schematic representation of the simulation procedure showing how knowledge of the location of the sensitive zones measured with the disclosed embodiments is used to evaluate the component's sensitivity to heavy ions or neutrons or protons.

FIG. 9 is a schematic representation of a simulation of attacks by heavy ions or other particles. With the disclosed embodiment, we have succeeded in defining positions of sensitive zones 36 and 37 in X, Y and Z in a component 1. For the sake of simplicity, it is convenient to consider that zones 36 and 37 are sensitive, and that the rest of the component is not sensitive. More generally, a coefficient of sensitivity may be assigned to each zone. Once this three-dimensional map has been created, component 1 is virtually bombarded with heavy ions, neutrons, protons, or other particles along various trajectories 38 and 39. The correlation between the results obtained with the laser and the results obtained in an accelerator is not direct because the mechanisms of interaction with the material are different. But theories are known that may serve as the basis for making these correlations. This means that it is possible to deduce the zones that are sensitive to particles from the zones that are sensitive to laser radiation.

In the example, beam 38 passes beside sensitive zone 36, while beam 39 is directed straight into the centre of zone 37. The occurrence or non-occurrence of a failure is measured depending on the direction and power of each beam. A sensitivity score is prepared for component 1 for a statistically relevant level of simulated bombardment activities.

The invention claimed is:

1. Method for measuring sensitivity to energy interactions in an electronic component, in which
    the electronic component is activated,
    the electronic component thus activated is excited using laser radiation,
    a malfunction of the activated electronic component corresponding to this excitation is measured, and
    a map is created on locations of interest in the component where these interactions are strongest,
    wherein
    the laser radiation is focused to various depths in the component,
    the energy interactions for the various depths are measured and wherein a hole is made in a protection of a wafer of the component,
    the hole having a smaller surface than a total surface of the wafer of the component,
    the hole having a surface larger than an impact trace of the laser radiation exciting the component,
    the impact trace having greater area than a surface of an elementary electronic cell implanted in the component.

2. The method according to claim 1, wherein
    the laser radiation is focused at different depths in the component for a location of interest.

3. The method according to claim 2,
    wherein
    for the purpose of measuring energy interaction, interactions of one or more of heavy ions, protons, and neutrons are measured by laser simulation.

4. The method according to claim 1, wherein
    for the purpose of measuring energy interaction, the interactions of one or more of heavy ions, protons, and neutrons are measured by laser simulation.

5. The method according to claim 1, wherein
    a power of the laser is varied for a given depth,
    and a critical power of the laser is determined,
    the critical power comprising a power for which, for the first time, the component provides an unexpected electronic response.

6. The method according to claim 1, wherein
    the component is excited on one face of the wafer of the component, opposite a face on which impurities are implanted.

7. The method according to claim 1, wherein
    the interaction is measured by comparing an output signal from the component with an expected value, and
    the conditions in which this comparison no longer satisfies a criterion are observed.

8. The method according to claim 1, wherein
    an energy of the laser radiation is greater than a value of an energy gap of the electronic component.

9. Device for performing the method according to claim 1.

* * * * *

UNITED STATES PATENT AND TRADEMARK OFFICE
CERTIFICATE OF CORRECTION

| | | |
|---|---|---|
| PATENT NO. | : 8,289,038 B2 | |
| APPLICATION NO. | : 12/297743 | |
| DATED | : October 16, 2012 | |
| INVENTOR(S) | : Miller et al. | |

It is certified that error appears in the above-identified patent and that said Letters Patent is hereby corrected as shown below:

On the title page item (73), in the Assignee, line 2, delete "COMPAI" and insert -- COMPANY EADS FRANCE -- therefor.

Signed and Sealed this
Second Day of April, 2013

Teresa Stanek Rea
*Acting Director of the United States Patent and Trademark Office*